(12) United States Patent
Pudas (10) Patent No.: US 11,261,526 B2
(45) Date of Patent: Mar. 1, 2022

(54) PARTICLE COATING (71) Applicant: Picosun Oy, Espoo (FI)

(72) Inventor: Marko Pudas, Espoo (FI)

(73) Assignee: Picosun Oy, Espoo (FI)

(*) Notice: Subject to any disclaimer, the term of this patent is extended or adjusted under 35 U.S.C. 154(b) by 136 days.

(21) Appl. No.: 16/331,738

(22) PCT Filed: Sep. 16, 2016

(86) PCT No.: PCT/FI2016/050645
§ 371 (c)(1),
(2) Date: Mar. 8, 2019

(87) PCT Pub. No.: WO2018/050954
PCT Pub. Date: Mar. 22, 2018

(65) Prior Publication Data
US 2019/0249302 A1 Aug. 15, 2019

(51) Int. Cl.
C23C 16/455 (2006.01)
C23C 16/44 (2006.01)
C23C 16/442 (2006.01)

(52) U.S. Cl.
CPC ...... *C23C 16/45544* (2013.01); *C23C 16/442* (2013.01); *C23C 16/4417* (2013.01); *C23C 16/45555* (2013.01)

(58) Field of Classification Search
None
See application file for complete search history.

(56) References Cited

U.S. PATENT DOCUMENTS

| 4,397,885 | A | * | 8/1983 | Akai | C09K 11/615 118/50.1 |
| 6,159,853 | A | | 12/2000 | Lai | |
| 2006/0062902 | A1 | * | 3/2006 | Sager | H01L 31/0384 427/74 |
| 2007/0074664 | A1 | | 4/2007 | Nishimura et al. | |
| 2007/0298250 | A1 | | 12/2007 | Weimer et al. | |

(Continued)

FOREIGN PATENT DOCUMENTS

CN 101016624 A 8/2007
DE 10001620 A1 7/2001

(Continued)

OTHER PUBLICATIONS

Japan Patent Office, Notification of Ground of Rejection, Application No. 2019512642, dated Sep. 2, 2020, 3 pages.

(Continued)

*Primary Examiner* — Karla A Moore
(74) *Attorney, Agent, or Firm* — Ziegler IP Law Group, LLC (57) ABSTRACT An atomic layer deposition (ALD) method in an ALD reactor including a reaction chamber housing a substrate vessel, and an isolated vibration source outside of the reaction chamber or isolated within the reaction chamber. Particulate material within the substrate vessel is coated by self-saturating surface reactions using a top-to-bottom precursor flow passing through the substrate vessel, and movements are caused in the particulate material within the substrate vessel by the isolated vibration source while coating the particulate material.

18 Claims, 7 Drawing Sheets

(56) References Cited

U.S. PATENT DOCUMENTS

| | | |
|---|---|---|
| 2009/0155590 A1 | 6/2009 | Kelder et al. |
| 2011/0003088 A1* | 1/2011 | Honda ................ B01J 2/12 427/569 |
| 2012/0003396 A1 | 1/2012 | Maas et al. |
| 2012/0009343 A1 | 1/2012 | Van Ommen |
| 2012/0085284 A1* | 4/2012 | Dassel ............... B01J 8/002 118/716 |
| 2013/0316077 A1* | 11/2013 | Dassel ............... C23C 16/442 427/213 |
| 2016/0258059 A1* | 9/2016 | Lee .................... C23C 16/442 |

FOREIGN PATENT DOCUMENTS

| | | |
|---|---|---|
| EP | 2161352 A1 | 3/2010 |
| JP | H02115565 U | 9/1990 |
| JP | H0726379 A | 1/1995 |
| JP | H07192683 A | 7/1995 |
| JP | 2015523199 A | 8/2015 |
| JP | 2016020418 A | 2/2016 |
| KR | 20140109234 A | 9/2014 |
| RU | 2541232 C2 | 2/2015 |
| WO | 2013171360 A1 | 11/2013 |
| WO | 2013176902 A1 | 11/2013 |
| WO | 2014114844 A1 | 7/2014 |
| WO | WO-2015009038 A1 * | 1/2015 ....... C23C 16/45544 |

OTHER PUBLICATIONS

Federal Service for Intellectual Property, Office Action, Application No. 2019108320. 12 Pages, dated Feb. 13, 2020.

Federal Service for Intellectual Property, Search Report. Application No. 2019108320, 3 Pages, dated Jan. 28, 2020.

McCormick et al. "Rotary reactor for atomic layer disposition on large quantities of nanoparticles" Journal of vacuum science and technology: Part A, vol. 25, No. 1 Jan./Feb. 2007, 8 pages.

International Search Report, Application No. PCT/FI2016/050645, dated Jun. 9, 2017, 5 pages.

Written Opinion of the Searching Authority, Application No. PCT/FI2016/050645, dated Jun. 9, 2017, 7 pages.

European Search Report, Application No. 16916157.7, dated Apr. 20, 2020. 7 Pages.

The Patent Office of the People's Republic of China, Notification of the First Office Action, Application No. 2016800891639, dated Dec. 15, 2020, 2 pages.

* cited by examiner

PARTICLE COATING

FIELD

The aspects of the disclosed embodiments generally relate to deposition reactors. More particularly, but not exclusively, the aspects of the disclosed embodiments relate to such deposition reactors in which material is deposited on surfaces by sequential self-saturating surface reactions.

BACKGROUND

This section illustrates useful background information without admission of any technique described herein representative of the state of the art.

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum $(CH_3)_3Al$, also referred to as TMA, and water at 250-300° C. resulting in only about 1% non-uniformity over a substrate wafer.

One interesting application of ALD technique is coating of small particles, for example powder material. It may be desirable, for example, to deposit a thin coating on particles to alter the surface properties of these particles while maintaining their bulk properties.

US 2009155590 A1 discloses a method for covering particles by means of atomic layer deposition, whereby said method comprises the step of fluidizing said particles in a fluidized bed reactor using a first reactant gas comprising a first reactant for substantially completely covering said particles with a monolayer of said first reactant.

WO 2013171360 A1 discloses a method in which a cartridge is received into an ALD reactor by a quick coupling method, and a fluidized bed is formed within the cartridge for deposition.

SUMMARY

According to a first example aspect of the disclosed embodiments there is provided a deposition method, comprising:
providing a deposition reactor with a substrate vessel in a reaction chamber;
providing an isolated vibration source outside of the reaction chamber or isolated within the reaction chamber;
coating particulate material within the substrate vessel by self-saturating surface reactions using a top-to-bottom precursor flow passing through the substrate vessel; and
causing movements in the particulate material within the substrate vessel by the isolated vibration source while coating the particulate material.

In certain example embodiments, movements are caused from the outside of the reaction chamber or from the outside of a reaction space of the reaction chamber. In certain example embodiments, the vibration is conducted to the reaction vessel without conducting the vibration to the body of the reactor. The vibration source in an embodiment is isolated from the reactor body. The vibration source in an embodiment is elastically isolated or isolated by non-contact means (e.g., physically separated or separated by a distance) from the reactor body. The substrate vessel in an embodiment is elastically isolated from the reactor body. The reactor body in an embodiment comprises the reaction chamber walls and a foreline.

As to the term "self-saturating surface reactions" defining the used technology as Atomic Layer Deposition, ALD, it is to be understood that ALD in this context also includes ALD sub-types, such as MLD (Molecular Layer Deposition), PEALD (Plasma Enhanced Atomic Layer Deposition) and photo-enhanced Atomic Layer Deposition (known also as flash enhanced ALD).

The term vibration is to be construed broadly covering also different shaking movements.

In certain example embodiments, the top-to-bottom precursor flow passes through the substrate vessel throughout the volume of the substrate vessel. Then there is no limited channel through the vessel but the chemical flow is downwards throughout the whole interior or whole volume defined by the substrate vessel to improve uniformity.

In certain example embodiments, the method comprises using a substrate vessel the volume of which is without transverse structures with regard to said top-to-bottom precursor flow. In certain example embodiments, the substrate vessel is non-rotating.

In certain example embodiments, the precursor flow to a foreline of the reaction chamber via any route other than through the particulate material is prevented to improve the efficiency of chemical flow and/or pressure balance in the reactor. In certain example embodiments, this is implemented by sealing. In certain example embodiments, a seal is positioned in between the substrate vessel and reaction chamber wall, or in between a substrate tray holding the substrate vessel and the reaction chamber wall. The seal may be an elastic seal, such as an O-ring seal. In certain other example embodiments, the substrate vessel or tray rests on a smooth plane or smooth edge of the reaction chamber wall without there being any seal or other elastic isolating element in between.

In certain example embodiments, the isolated vibration source is provided with elastic or contactless isolation from reaction chamber walls. In certain example embodiments, the vibration is conducted to the substrate vessel, a container that is separate from the reaction chamber walls.

In certain example embodiments, the method comprises transferring vibration from the vibration source via a waveguide to the particulate material.

In certain example embodiments, the method comprises causing movements in the particulate material by inducing vibration from the vibration source via wireless induction. In certain example embodiments, the vibration is induced via the substrate vessel. In certain example embodiments, the vibration is induced by waveguide assisted induction.

In certain example embodiments, the substrate vessel is elastically isolated from the reaction chamber wall.

In certain example embodiments, ultrasonic vibration is used to cause movements in the particulate material. In certain example embodiments, accordingly, the vibration source generates ultrasonic vibration. In certain example embodiments, ultrasonic vibration is conveyed from an ultrasonic vibration source to the particulate material.

In certain example embodiments, the method comprises conveying vibration via a waveguide to the substrate vessel. In certain example embodiments, vibration energy is transferred by its own power from the vibration source to the particulate material.

In certain example embodiments, the method comprises: conveying ultrasonic vibrations from the vibration source to the reaction vessel via a waveguide element positioned in a foreline of the reaction chamber.

In certain example embodiments, the vibration source is elastically isolated from a foreline of the reaction chamber. In certain example embodiments, the vibration source is physically separated from the foreline by an elastic element.

In certain example embodiments, the vibration source isolated within the reaction chamber is positioned within vacuum conditions. In certain example embodiments, the vibration source isolated within the reaction chamber is positioned outside of a reaction space (through which the vertical flow of precursor vapor passes) but inside of the total space limited by the reaction chamber walls. In certain example embodiments, this vibration source is separated from a main volume of the reaction chamber. It may be positioned in a limited space or further chamber separated from the main volume of the reaction chamber. The limited space may be separated by a narrow passage from the remaining part of the reaction chamber. The process conditions, e.g., temperature and/or pressure during ALD processing in the limited space may differ from the conditions within the remaining part of the reaction chamber. In an example embodiment, the temperature within the limited space is lower compared to the temperature within the remaining part of the reaction chamber allowing a more temperature sensitive vibration source to be used. In an example embodiment, the pressure within the limited space is higher compared to the pressure within the remaining part of the reaction chamber thereby preventing precursor vapor (or reactants) from entering the limited space housing the vibration source. In an embodiment, there is provided a purge gas flow into the limited space and therefrom towards the remaining part (or reaction space) of the reaction chamber for preventing precursor vapor (or reactants) from entering the limited space.

In certain example embodiments, the method comprises: isolating the vibration source (that is isolated within the reaction chamber) from the remaining part of the reaction chamber by process conditions.

In certain example embodiments, the vibration source that is isolated within the reaction chamber is separated from a main volume of the reaction chamber (or from the reaction space).

One example of the many applications of the disclosed method is depositing a moisture barrier coating for moisture sensitive particles.

According to a second example aspect of the disclosed embodiments there is provided deposition reactor, comprising
a reaction chamber housing a substrate vessel; and
an isolated vibration source outside of the reaction chamber or isolated within the reaction chamber, the deposition reactor being configured to coat particulate material within the substrate vessel by self-saturating surface reactions using a top-to-bottom precursor flow passing through the substrate vessel and to cause movements in the particulate material within the substrate vessel by the isolated vibration source while coating the particulate material.

The reactor (ALD reactor) may be a non-fluidized bed reactor. The used chemicals (such as precursor vapor) may simply travel through the particulate material downwards. Embodiments of the invention allow a cross-flow reactor with uniform chemical flow in top-to-bottom direction passing through a permeable substrate vessel. In certain example embodiments, the bottom of the substrate vessel is permeable allowing precursor vapor or gases, but not the particulate material, to pass through. In certain example embodiments, the substrate vessel has a permeable lid allowing precursor vapor or gases, but not the particulate material, to pass through. In certain example embodiments, the reaction chamber has a circular cross section.

In certain example embodiments, the substrate vessel is configured to pass the top-to-bottom precursor flow throughout the volume of the substrate vessel.

In certain example embodiments, the volume defined by the substrate vessel is without transverse structures with regard to said top-to-bottom precursor flow.

In certain example embodiments, the substrate vessel has a circular cross section.

In certain example embodiments, the reactor comprises elastic or contactless isolation that isolates the vibration source from the reaction chamber.

In certain example embodiments, the deposition reactor comprises:
a waveguide element configured to transfer vibration from the vibration source to the particulate material. In certain example embodiments, the waveguide element is positioned in a foreline of the reaction chamber.

In certain example embodiments, the vibration source is configured to cause movements in the particulate material by inducing vibration via wireless induction.

In certain example embodiments, the vibration source is configured to generate ultrasonic vibration.

In certain example embodiments, the reactor is configured to convey ultrasonic vibrations from the vibration source to the reaction vessel via a waveguide element positioned in a foreline of the reaction chamber.

In certain example embodiments, the vibration source is elastically isolated from a foreline of the reaction chamber. In certain example embodiments, the deposition reactor comprises a first elastic isolating element configured to isolate the vibration source in order to prevent undesired vibration.

In certain example embodiments, the substrate vessel is elastically isolated from the reaction chamber wall. In certain example embodiments, the deposition reactor comprises a second elastic isolating element or an elastic seal configured to isolate the substrate vessel in order to prevent undesired vibration.

In certain example embodiments, the reactor comprises a substrate tray configured to hold thereon the substrate vessel. In certain example embodiments, the generated vibration is conveyed to the substrate tray in order to vibrate the substrate tray and therethrough the particulate material in the substrate vessel residing thereon. In certain example embodiments, the substrate tray is permeable allowing precursor vapor or gases, but not the particulate material, to pass through. In certain example embodiments, the top-to-bottom vertical flow of gases is allowed to continue through both the substrate vessel and substrate tray.

In certain example embodiments, the vibration source that is isolated within the reaction chamber is separated from a main volume of the reaction chamber.

According to a third example aspect of the disclosed embodiments there is provided a deposition method comprising:
providing a sample of particulate material in a substrate vessel into a reaction chamber;
causing the particulate material to be vibrated by conveying vibrations from a vibrator element via a waveguide element to the sample; and coating the particulate material using self-saturating surface reactions.

According to a fourth example aspect of the disclosed embodiments there is provided a deposition reactor comprising:
a reaction chamber;
a substrate vessel configured to hold a sample of particulate material;
an ultrasonic vibrator element configured to provide ultrasonic vibrations; and
a waveguide element configured to convey ultrasonic vibrations from the ultrasonic vibrator element to the sample in order to cause the particulate material to be vibrated.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate. It is to be understood, however, that one of these reactive precursors can be substituted by energy when using photo-enhanced ALD or PEALD, leading to single precursor ALD processes. The substrate is located within a reaction space. The reaction space is typically heated. The basic growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

The reaction space of an ALD reactor comprises all, typically heated, surfaces that can be exposed alternately and sequentially to each of the ALD precursor used for the deposition of thin films or coatings. A basic ALD deposition cycle consists of four sequential steps: pulse A, purge A, pulse B and purge B. Pulse A typically consists of metal precursor vapor and pulse B of non-metal precursor vapor, especially nitrogen or oxygen precursor vapor. Inactive gas, such as nitrogen or argon, and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness.

In a typical ALD process, precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is typically followed by a first purge step (purge A) wherein the excess first precursor and possible reaction by-products are removed from the reaction space. Second precursor vapor is then introduced into the reaction space. Second precursor molecules typically react with the adsorbed species of the first precursor molecules, thereby forming the desired thin film material or coating. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film or coating has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

In certain example embodiments as described in the following, thin conformal coatings are provided onto the surfaces of various particulate, or powder-form, materials. The size of the particles depends on the particular material and the particular application. Suitable particle sizes typically range from the nanometer range up to the range of hundreds of micrometers. Furthermore, particles to be coated can be larger in size, as the process does not limit the size or shape of the particles. Accordingly, in certain example embodiments, particles in the range of several millimeters can be coated. A wide variety of particulate materials can be used. The composition of a base particle and that of the coating is typically selected together so that the surface characteristics of the particle are modified in a way that is desirable for a particular application. The base particles preferably have some functional group on the surface that participates in an ALD reaction sequence that creates the coating, or the ALD process steps can create the reactive sites. Coating particulate material in such a way that substantially all sides of the surfaces of substantially all of the particles are coated is enabled by preventing agglomeration of particles and providing a way to expose all sides of the surfaces to precursor exposure for self-saturating surface reactions.

Figure 1:
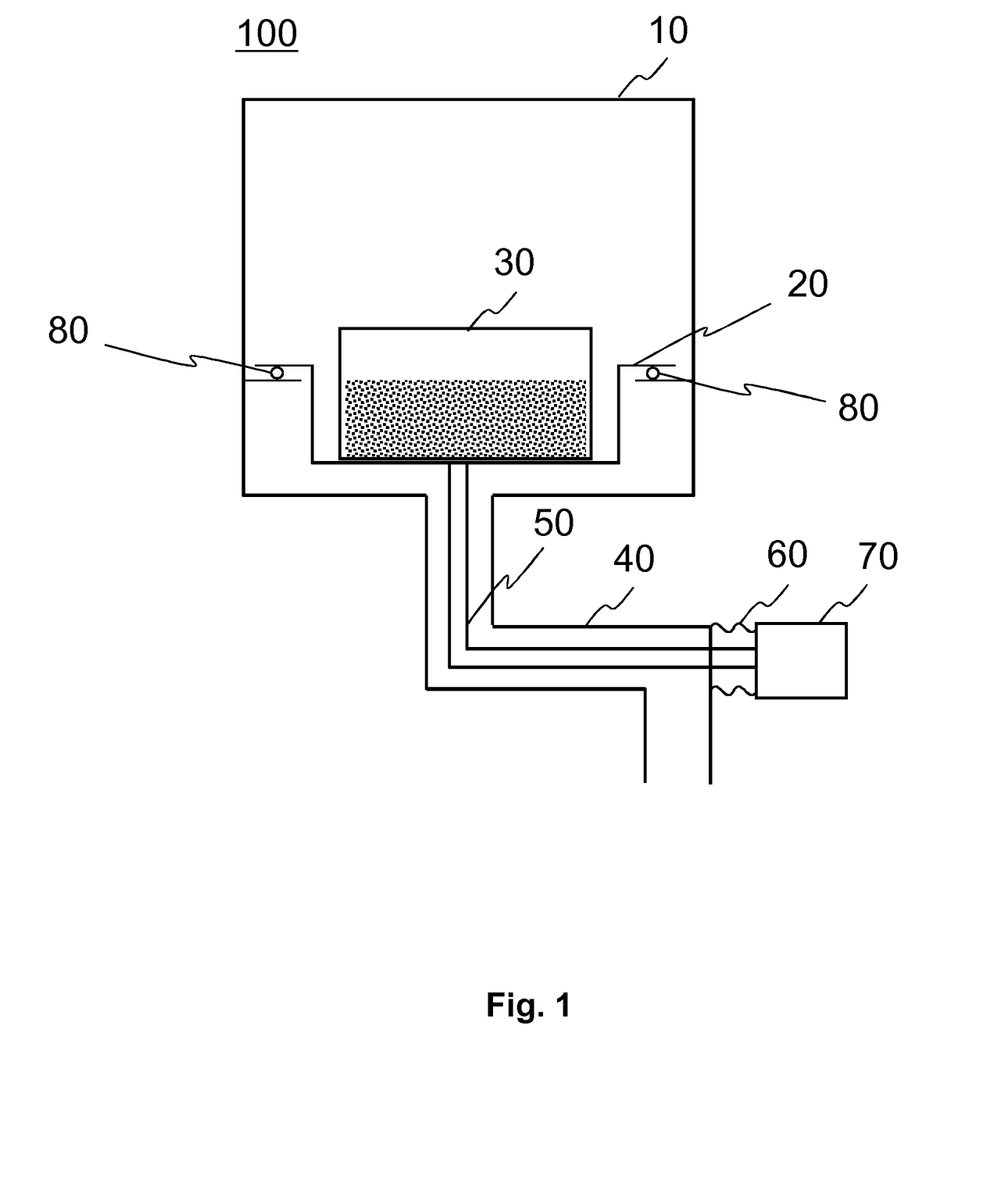
FIG. 1 shows a schematic principle view of a deposition reactor in accordance with an example embodiment of the disclosed embodiments.

FIG. 1 shows a schematic principle view of a deposition reactor 100 in accordance with an example embodiment of the present disclosure. In an example embodiment, the deposition reactor is an atomic layer deposition, ALD, reactor. The reactor 100 comprises a reaction chamber 10. In an embodiment, the reactor comprises a further chamber housing the reaction chamber 10 although in the schematic view of FIG. 1 only a single chamber is shown. The reactor 100 further comprises, inside the reaction chamber 10 a substrate, or sample, tray 20 configured to hold thereon a substrate vessel 30 containing the substrate or sample to be coated. In an embodiment, the substrate vessel 30 contains particulate material, for example powder, to be coated by self-saturating surface reactions.

The reactor 100 further comprises, inside the reaction chamber 10, one or more gas inlets above the substrate vessel 30. Carrier and/or reactive gases (precursor gases) in an embodiment go through the particulate material as a top-to-bottom flow.

The reactor 100 further comprises a foreline (an exhaust channel) 40 configured for removal of gases, for example precursor gases, from the reaction chamber 10. In an embodiment, as shown in FIG. 1, the foreline 40 is located at the bottom of the reaction chamber 10. However, in a further embodiment, the foreline can be located differently, for example, through a sidewall of the reaction chamber 10. The tray 20 is arranged so that gases can pass through it from the substrate vessel 30 to the foreline 40.

FIG. 1 further shows a vibrator element 70, such as an ultrasonic wave generator, configured to provide vibrations. In an embodiment, the vibrator element 70 is connected to a waveguide element 50 configured to convey the generated vibration (e.g., ultrasound vibration) to the substrate tray 20 in order to vibrate the substrate tray 20 and therethrough the particulate material in the substrate vessel 30 residing thereon. However, in an alternative embodiment, the waveguide element 50 is connected directly to the substrate vessel 30 (the substrate tray 20 can be omitted). Yet in another alternative embodiment the waveguide element 50 is only in contact with the particulate material, without inducing the vibration first to vessel 30. The vibration of the particulate material prevents agglomeration of the material, enables the reactive gases to reach all of the material surfaces and therefore provides for a uniform coating on all sides of the particles by allowing the precursor gases to penetrate the particular material throughout. In an embodiment, the vibrator element 70 comprises for example a piezoelectric ultrasound emitter element.

In an embodiment, the waveguide element 50 is positioned in the foreline 40 of the reaction chamber 10 and the vibrator element 70 is positioned next to the foreline and attached thereto through a first elastic isolating element 60 configured to prevent vibrations from being induced to the foreline 40 and therethrough to further parts of the reactor 100, such as to the wall of the reaction chamber 10. In a further embodiment, the waveguide is connected to the substrate tray 20 and/or the substrate vessel 30 through a different route, for example, through the top of the reaction chamber and isolated in a manner similar to hereinbefore described in order to prevent undesired vibrations, which would cause, inter alia, loss of energy.

Furthermore, the substrate tray 20 and/or substrate vessel 30 preferably lack a fixed connection to the reaction chamber 10. Accordingly, the substrate vessel 30 is in an embodiment isolated from the reaction chamber 10 wall by an isolating element. There may be a, for example a second elastic isolating element 80, such as an O-ring, in order to prevent undesired vibrations from being propagated from the substrate tray 20 (if any) and/or the substrate vessel 30 to the wall of the reaction chamber 10. The isolating element 80 is placed at a position in between the reaction vessel 30 and the reaction chamber 10 wall. In an example, as shown in FIG. 1, the isolating element is placed in between the tray 20 and a collar in the reaction chamber 10 wall.

Figure 2:
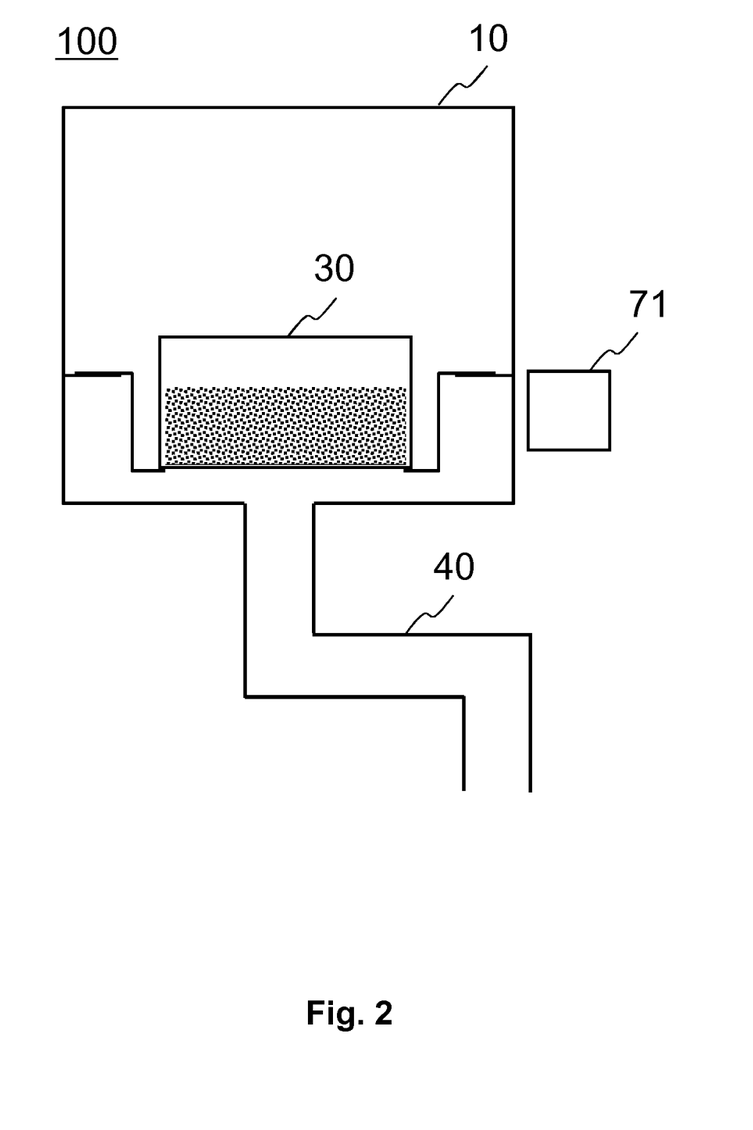
FIG. 2 shows a schematic principle view of a deposition reactor in accordance with another example embodiment of the disclosed embodiments.

FIG. 2 shows a schematic principle view of a deposition reactor in accordance with another example embodiment of the invention. In this embodiment, the basic structure of the reaction chamber 10 and the substrate vessel 30 correspond to those described in connection with FIG. 1. The vibration is transferred from an isolated source 71 to the substrate vessel 30 by non-contact means. This is realized in an embodiment by actuating the substrate vessel 30 directly by an external field (or signal) generated by the source 71, such as by a magnetic or electromagnetic field, or by electromagnetic induction. The isolated source 71 is positioned on the outside of the reaction chamber 10. The substrate vessel 30 in an embodiment has a matching feature that is configured to receive an energy carrying actuation signal generated by the source 71. For example, the substrate vessel 30 in an embodiment is made of material matching to the energy carrying actuation signal, or the substrate vessel 30 may have one or more embedded receivers which receive the energy. The receiving of the (outside) signal (or energy) can alternatively occur by a part which is attached to the substrate vessel 30, similar to the substrate tray 20 in FIG. 1 (not shown in FIG. 2). The substrate vessel 30 and/or the substrate tray 20 can be isolated from the reaction chamber 10 wall by an isolating element similarly as described in connection with FIG. 1.

Figure 3:
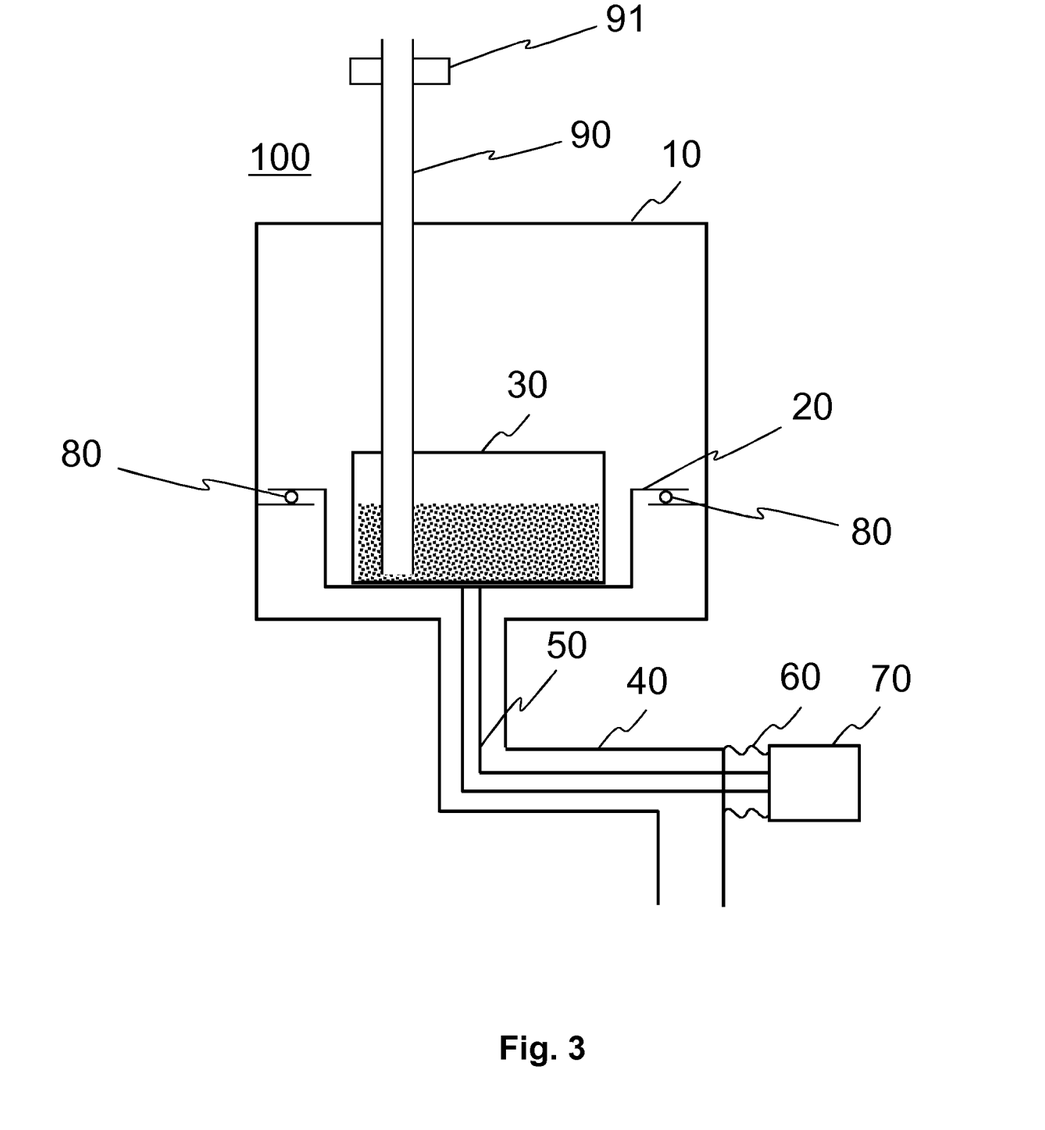
FIG. 3 shows a further detail in the deposition reactor of FIG. 1.

FIG. 3 shows similar assembly as in FIG. 1 with the addition of a sample delivery tube 90. The reactor can comprise a sample delivery tube 90, or multiple tubes, extending from the outside of the reaction chamber 10 into the substrate vessel 30. The tube or tubes 90 enable pouring in the particulate material before deposition, and taking out the particulate material after deposition in some embodiments. The tube or tubes 90 in an embodiment have a valve and/or gas flow controller 91 so that the coating process can be performed in vacuum and the removal of the particulate material with the aid of suction, for example. In an embodiment, the removal is arranged when the reaction chamber is in ambient pressure after deposition by arranging a pressure (for example by applying an inactive gas flow) under the substrate vessel 30 from the direction of the foreline 40 this pressure being higher than the pressure of the tube(s) 90. The resulting backflow pushes the coated particulate material out from the reaction vessel 30 via the tube(s) 90.

Although FIG. 3 presents that the sample delivery tube 90 extends to the bottom of the substrate vessel 30 in other embodiments the positioning of the tube(s) 90 can be different. For example, the tube 90 can only extend to an upper edge or a side of the vessel 30.

In an embodiment, the sample delivery tube(s) 90 deliver the particulate material into the reaction chamber 10 or substrate vessel 30 with the aid of fluid or gravity. If the material to be coated is carried with a fluid flow to the substrate vessel 30, the tube(s) 90 can be used as fluid flow channels with the means of closure 91. In an embodiment, these means are linked to a process control to enable, for example, batch processing. When gravity is used, the reactor can be configured to move. The tube(s) 90 can be configured to close by the means of closure 91 accordingly to block the sample flow. In another embodiment, the loading, deposition and unloading process can be seemingly continuous.

Figure 4:
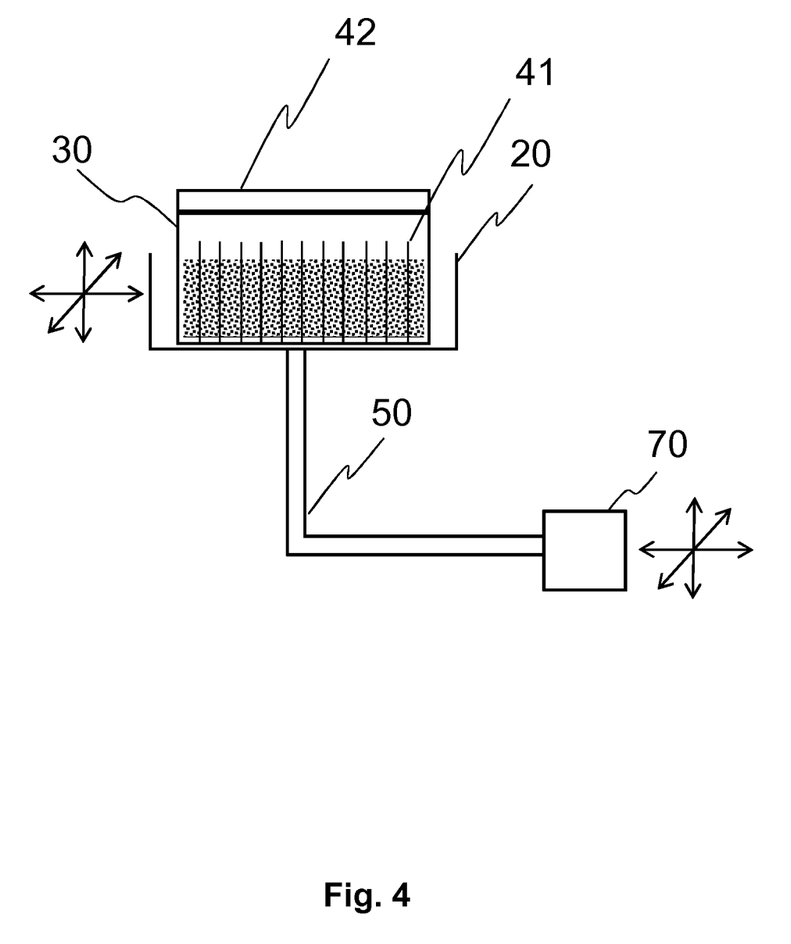
FIG. 4 shows a schematic principle view of a vibration arrangement of a deposition reactor in accordance with an example embodiment of the disclosed embodiments.

FIG. 4 shows a schematic principle view of a vibration arrangement of a deposition reactor in accordance with an example embodiment of the invention.

The vibrating arrangement, as described also with reference to FIG. 1, comprises a vibrator element 70 and a waveguide element 50 connected to the substrate tray 20 and/or to the substrate vessel 30. FIG. 4 further shows the direction of the vibrations generated in three dimensions. The number of dimensions in which vibration is generated depend on the implementation. In some embodiments vibration is generated only in two dimensions and in some embodiments only in one dimension.

The substrate vessel 30 is configured so that reactive gases can flow from top to down, through it, towards the exhaust channel (foreline 40, FIGS. 1-3). The substrate vessel 30 may be shaped as a plate or an open cup. On top of it, in an embodiment, there is an inlet filter or grid 42. The bottom of the substrate vessel 30 is permeable allowing gases (but not the particulate material to be coated) to pass through. The bottom of the vessel therefore can comprise a filter (not shown in FIG. 4). Also the substrate tray 20 may be permeable (comprising a particle filter through which gases will pass).

In further embodiments, the substrate vessel 30 is arranged so that the particulate material has a certain maximum distance to the part (for example, a surface or edge of the vessel 30) which receives and transmits the vibration to the particulate material. In an embodiment, this is arranged with or in combination of one or more of the following:
- the particulate material layer has a limited thickness on the filter (i.e., substrate vessel 30 bottom)
- the vessel 30 has elements 41 (FIG. 4) attached to its bottom or edges, such as lamellas or wires, which conduct the vibration to the particulate material
- the vessel 30 comprises a plurality of sub-containers where the sub-container walls conduct the vibration.

It is to be understood, that as in the previous examples, the vibration can be conducted directly from the wave guide 50 to substrate vessel 30, or even directly from wave guide 50 to elements 41, without the waveguide 50 being in mechanical contact with the reaction vessel 30. It is further to be understood, that the element 41 can be actuated by the vibration source 71, with non-contact means.

The part 42 mentioned in the preceding is in an embodiment a porous or filter lid. It can form part of the substrate vessel 30 or it can be a part on top of the substrate vessel 30. The lid in an embodiment prevents particle dust from coming out. It will further diffuse the chemicals incoming into the vessel 30.

In the following, certain further embodiments are disclosed:

In an embodiment, the substrate tray 20 (FIGS. 1, 2 and 4) is configured to lie on the reaction chamber 10 edges, or on a shape of the reaction chamber wall, so as to generate a higher pressure over the substrate vessel 30 (compared to the pressure under it) towards the foreline 40.

In a further embodiment, the reaction chamber 10 has a thermal sensor or multiple sensors attached to it, configured to measure the temperature of the particulate material, by physically touching the particulate material (with e.g. an electrical thermocouple), or by optical means (not shown).

In an embodiment, the substrate vessel 30 and/or the substrate tray 20 is arranged to rest on the reaction chamber 10, or on a part mounted on the reaction chamber 10 so that mechanical force from the tray 20, vessel 30 or element 41 does not effectively transfer to the reaction chamber 10 (or reaction chamber 10 wall). The tray 20 or vessel 30 can, for example, rest on a smooth plane or smooth edge arranged as a part of the reaction chamber 10. The elastic isolating element 80 can be omitted.

In an embodiment, the vibrator element 70, 71 is positioned outside of the reaction chamber 10 but inside vacuum conditions, for example inside a surrounding vacuum chamber. In other embodiments, the vibrator element is positioned on the outside of vacuum conditions, e.g., on the outside of the physical boundaries of vacuum parts of the reactor 100, when the used vibrator element does not withstand vacuum conditions. In further embodiments, the vibrator element 70 can be partly or completely located inside the vacuum parts of the reactor 100. In a further embodiment, the vibrator element is directly attached to the part 20 and/or 30 without a waveguide. In alternative embodiments, the parts 20 and 50 are combined to form one part, parts 20 and 30 are combined to form one part, or parts 20, 30 and 50 are combined to form one part.

Although not shown in FIGS. 1-4, the deposition reactor 100 comprises further elements common for Atomic Layer Deposition reactors. Such elements include in an embodiment gas in-feed lines, for example for precursor, inert and/or purge gases; heating and/or cooling elements; loading and unloading means; pressure control means and temperature control means.

The substrate tray 20 in an embodiment is an edged holding part. The reaction chamber 10 can have arrangements for leading small quantities of incoming gases past the edged holding part 20 (in addition of going through the substrate vessel 30), in order to prevent deposition on places which are left without a purging gas flow, i.e., the space at the side corner in between the vertical portion of part 20 and the reaction chamber 10 wall. Small quantities of gas can be led to these places with additional gas inlet tubes (not shown). The gas can be non-reactive, reactive or passivating with respect to the gases coming through the vessel 30.

In an embodiment, gas flows into and out of the reaction chamber 10 can be changed so as to affect the pressure over the sample in vessel 30. This is accomplished, for example, by controlling the pulsing of the chemicals, or changing the incoming gas flow or vacuum in the foreline. In an embodiment, flow control is performed to maintain the selected pressure over the sample in vessel 30, with pressure sensors, for example. In an embodiment, flow control is performed to maintain the selected flow through the sample in vessel 30, with mass flow controllers, for example.

In a further embodiment, backflow generated similarly as described in the preceding in connection with FIG. 3 is used to clean filters within the reaction chamber 10, for example filter 42 (if in use), and/or to decrease pore blocking.

Figure 5:
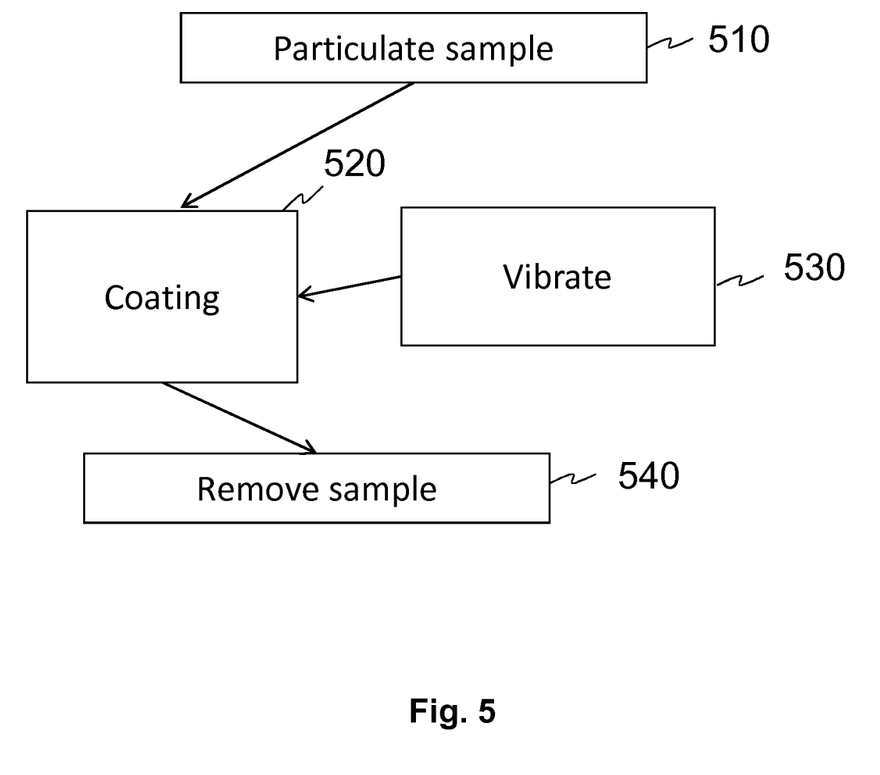
FIG. 5 shows a principle flow chart of method for coating particles in accordance with an example embodiment of the disclosed embodiments.

FIG. 5 shows a principle flow chart of method for coating particles in accordance with an example embodiment of the invention. At step 510, a particulate sample to be coated is provided in the substrate vessel 30 and placed on the substrate tray 20 in the reaction chamber 10. At step 520 the particulate sample is made to vibrate using the (ultrasonic) vibrator element and guiding the produced ultrasound with the waveguide element 50 to the substrate tray 20 and therethrough to the particulate sample in the substrate vessel 30. At step 530 the particulate sample is coated by a deposition process using self-saturating surface reactions. In an embodiment, the deposition process is an atomic layer deposition, ALD, process. The vibration during coating prevents agglomeration of the particulate material and provides for uniform coating of the particles. At step 540, the coated sample is removed from the reaction chamber 10.

Figure 6:
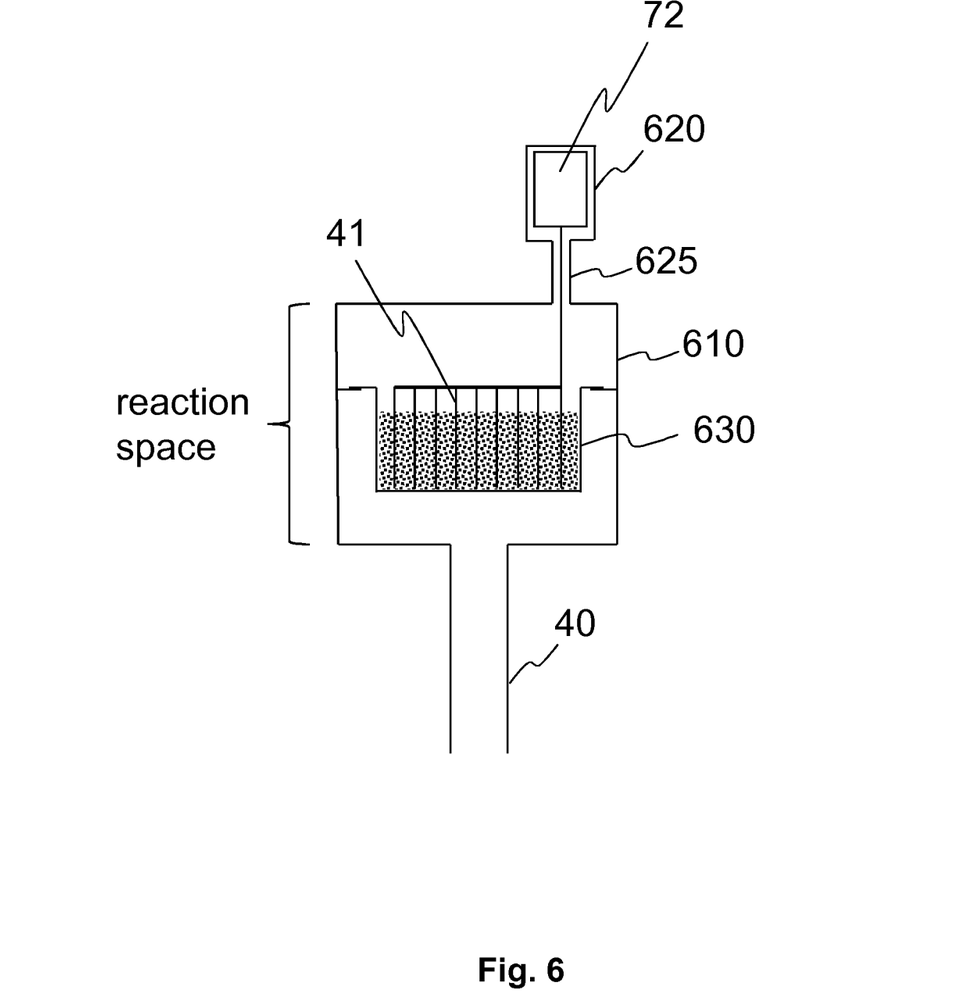
FIG. 6 shows a schematic principle view of a deposition reactor with a vibration source within vacuum conditions in accordance with an example embodiment of the disclosed embodiments.

FIG. 6. shows a schematic principle view of a deposition reactor with a vibration source within vacuum conditions in accordance with an example embodiment of the invention. FIG. 6 shows a deposition reactor assembly, where the vibration source (e.g., ultrasonic actuator) 72 is arranged inside vacuum. The elastic isolating element 60 can be omitted. The vibration source 72 is positioned in a limited space 620 separated from the remaining part of the reaction chamber (or reaction space) 610 by a narrow passage 625. The substrate vessel 630 contains the particulate material to be coated. The source 72 transfers vibration directly to the particulate material without inducing vibration to the substrate vessel 630 and/or without contacting the substrate vessel 630. The elastic isolating element 80 can be omitted. The vibration conductor part 41 or similar may be used in transferring the vibration from the source 72 directly to the particulate material. The vibration conductor part 41 may be in the form of a rake or similar.

The process conditions, e.g., temperature and/or pressure during ALD processing in the limited 620 space are arranged to differ from the conditions within the remaining part of the reaction chamber 610. In an example embodiment, the temperature within the limited space 620 is lower compared to the temperature within the remaining part of the reaction chamber 610 allowing a more temperature sensitive vibration source 72 to be used. In an example embodiment, the pressure within the limited space 620 is higher compared to the pressure within the remaining part of the reaction chamber 610 thereby preventing precursor vapor (or reactants) from entering the limited space 620 housing the vibration source 72. In an embodiment, there is provided a purge gas flow into the limited space 620 and therefrom towards the remaining part (or reaction space) of the reaction chamber 610 for preventing precursor vapor (or reactants) from entering the limited space 620.

In an example embodiment, such as shown in FIG. 6, the vibration source 72 is arranged outside of the heated part of the reaction chamber 610. Further the vibration source 72 can be kept cool by mechanically coupling it to the chamber wall, or to a cooling structure (not shown), or by flowing carrier or purge gas past it towards foreline 40 (an inlet gas pipe into the space housing the source 72 is not shown in FIG. 6). Further, the carrier or purge gas can be used to keep the source 72 free of contact from the reactive chemicals. In further embodiments, the source 72 can be alternatively positioned in another place, for example, below the substrate vessel 630 as shown in FIGS. 1-4. Further, the arrangement of FIG. 6 enables the direct connection to element 41 and/or to substrate vessel 30 and/or to tray 20.

Figure 7:
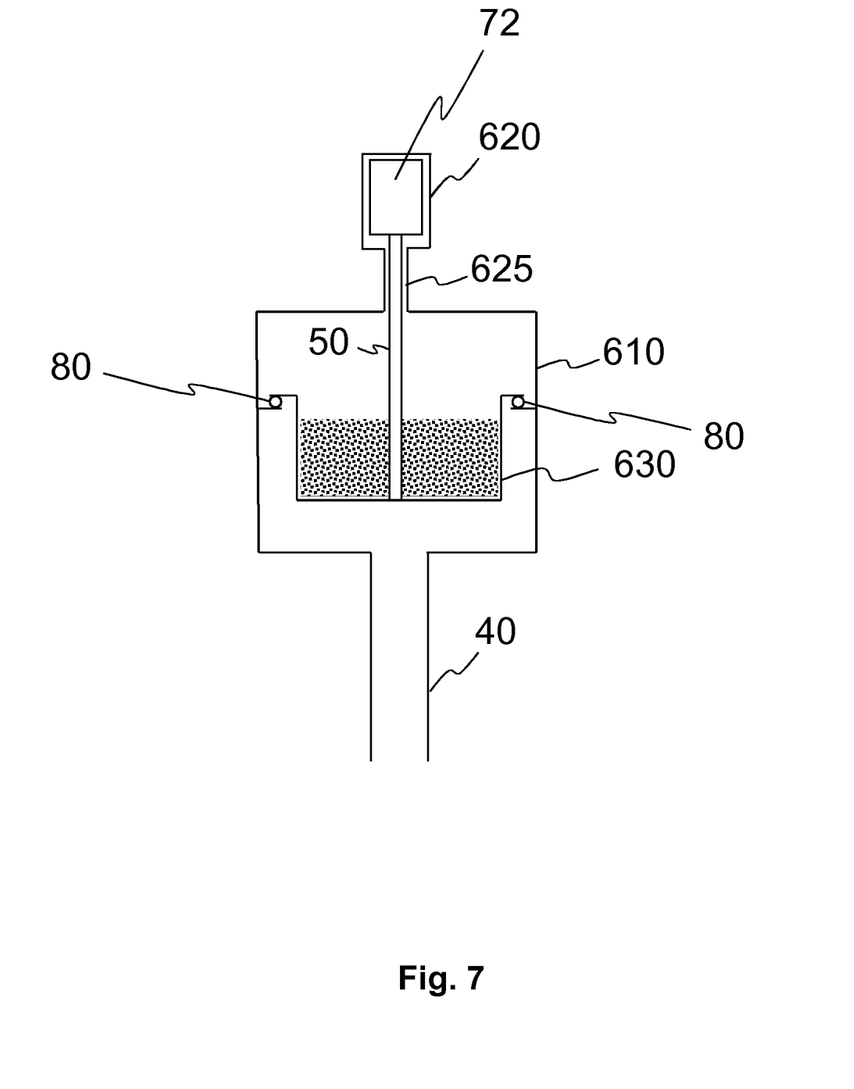
FIG. 7 shows a schematic principle view of a deposition reactor with a vibration source within vacuum conditions in accordance with another example embodiment of the disclosed embodiments.

FIG. 7 shows a schematic principle view of a deposition reactor with a vibration source within vacuum conditions in accordance with another example embodiment of the invention. In this embodiment, the waveguide 50 is positioned in between the source 72 and the particulate material. The waveguide 50 conducts vibration from the source 72 to the particulate material. Otherwise the description describing the embodiment shown in FIG. 6 is referred to. In practice, the waveguide 50 may connect for example the vibration source 72 and the substrate vessel 30, or the vibration source 72 and the substrate tray (if any), or the vibration source 72 and elements 41 (if any). The vibration, such as ultrasonic vibration, is then conducted from the vibration source 72 to the substrate vessel 630 or via the substrate tray to the substrate vessel 630, or directly to the elements 41 as described in the foregoing with reference to FIGS. 1-5.

In embodiments of the present disclosure, vibration activity can be switched on and off as desired. During an active mode of operation, vibration can be "on" all the time or it may be "on" in a pulse-wise manner. In an example embodiment, the vibration is pulsing in 1 second cycles, with on time of 30% and off time of 70%. During a passive mode of operation the vibration is off. In an embodiment, the vibration is "on" only when the particulate material is on vacuum. The vibration "on" stages can further be synchronized with the chemical pulsing. Further the frequency and amplitude of vibration can be adjusted accordingly.

Without in any way limiting the scope of protection, interpretation or possible applications of the present disclosure, a technical advantage of different embodiments of the present disclosure may be considered to be a more uniform coating of particulate material. Further, a technical advantage of different embodiments of the present disclosure may be considered to be a simple prevention of agglomeration of material. Still further, a technical advantage of different embodiments of the invention may be considered to the provision of vibrations to the sample without undesired vibrations to the reactor body.

The foregoing description has provided by way of non-limiting examples of particular implementations and embodiments of the present disclosure a full and informative description of the best mode presently contemplated by the inventors for carrying out the invention. It is however clear to a person skilled in the art that the is not restricted to details of the embodiments presented above, but that it can be implemented in other embodiments using equivalent means without deviating from the characteristics of the present disclosure.

Furthermore, some of the features of the above-disclosed embodiments of the present disclosure may be used to advantage without the corresponding use of other features. As such, the foregoing description should be considered as merely illustrative of the principles of the present disclosure, and not in limitation thereof. Hence, the scope of the present disclosure is only restricted by the appended patent claims.

The invention claimed is:

1. A deposition method comprising:
    providing a deposition reactor with a substrate vessel in a reaction chamber;
    providing an isolated vibration source outside of the reaction chamber, and conveying ultrasonic vibrations from the isolated vibration source to the substrate vessel via a waveguide element positioned in a foreline connected to the reaction chamber;

coating particulate material within the substrate vessel by self-saturating surface reactions using a top-to-bottom precursor flow passing through the substrate vessel; and causing movements in the particulate material within the substrate vessel by the isolated vibration source while coating the particulate material.

2. The method of claim 1, wherein the top-to-bottom precursor flow passes through the substrate vessel throughout the volume of the substrate vessel.

3. The method of claim 1, comprising:
using the substrate vessel the volume of which is without transverse structures with regard to said top-to-bottom precursor flow.

4. The method of claim 1, wherein the isolated vibration source is provided with elastic or contactless isolation from reaction chamber walls.

5. The method of claim 1, comprising:
transferring vibration from the vibration source via waveguide to the particulate material.

6. The method of claim 1, comprising:
causing movements in the particulate material by inducing vibration from the vibration source via wireless induction.

7. The method of claim 1, wherein the substrate vessel is elastically isolated from the reaction chamber wall.

8. The method of claim 1, wherein the vibration source generates ultrasonic vibration.

9. The method of claim 1, wherein the vibration source is elastically isolated from the foreline.

10. A deposition reactor, comprising:
a reaction chamber housing a substrate vessel; and
an isolated vibration source outside of the reaction chamber, the reactor being configured to convey ultrasonic vibrations from the isolated vibration source to the substrate vessel via a waveguide element positioned in a foreline connected to the reaction chamber, the deposition reactor being configured to coat particulate material within the substrate vessel by self-saturating surface reactions using a top-to-bottom precursor flow passing through the substrate vessel and to cause movements in the particulate material within the substrate vessel by the isolated vibration source while coating the particulate material.

11. The deposition reactor of claim 10, wherein the substrate vessel is configured to pass the top-to-bottom precursor flow throughout the volume of the substrate vessel.

12. The deposition reactor of claim 10, wherein the volume defined by the substrate vessel is gas permeable without transverse structures.

13. The deposition reactor of claim 10, wherein the reactor comprises elastic or contactless isolation that isolates the vibration source from the reaction chamber.

14. The deposition reactor of claim 10, wherein
the waveguide element is configured to transfer vibration from the vibration source to the particulate material.

15. The deposition reactor of claim 10, wherein the vibration source is configured to cause movements in the particulate material by inducing vibration via wireless induction.

16. The deposition reactor of claim 10, wherein the substrate vessel is elastically isolated from the reaction chamber wall.

17. The deposition reactor of claim 10, wherein the vibration source is configured to generate ultrasonic vibration.

18. The deposition reactor of claim 10, wherein the vibration source is elastically isolated from the foreline.

* * * * *

UNITED STATES PATENT AND TRADEMARK OFFICE
CERTIFICATE OF CORRECTION

PATENT NO. : 11,261,526 B2  
APPLICATION NO. : 16/331738  
DATED : March 1, 2022  
INVENTOR(S) : Marko Pudas

Page 1 of 1

It is certified that error appears in the above-identified patent and that said Letters Patent is hereby corrected as shown below:

In the Claims

In Column 13, Claim 5, Lines 2 and 3, delete "waveguide" and insert --the waveguide element--.

Signed and Sealed this
Twenty-first Day of June, 2022

Katherine Kelly Vidal
*Director of the United States Patent and Trademark Office*